(12) United States Patent
Xu et al.

(10) Patent No.: US 11,107,880 B2
(45) Date of Patent: Aug. 31, 2021

(54) CAPACITOR STRUCTURE FOR INTEGRATED CIRCUIT, AND RELATED METHODS

(71) Applicant: GLOBALFOUNDRIES U.S. Inc., Santa Clara, CA (US)

(72) Inventors: Dewei Xu, Clifton Park, NY (US); Sunil K. Singh, Mechanicville, NY (US); Siva R. Dangeti, Rexford, NY (US); Seung-Yeop Kook, Mechanicville, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/408,536

(22) Filed: May 10, 2019

(65) Prior Publication Data

US 2020/0357880 A1 Nov. 12, 2020

(51) Int. Cl.
*H01L 49/02* (2006.01)
*H01L 21/311* (2006.01)
*H01L 21/321* (2006.01)
*H01L 21/283* (2006.01)
*H01L 21/02* (2006.01)

(52) U.S. Cl.
CPC .......... *H01L 28/60* (2013.01); *H01L 21/0217* (2013.01); *H01L 21/283* (2013.01); *H01L 21/31144* (2013.01); *H01L 21/3212* (2013.01)

(58) Field of Classification Search
CPC .................................................... H01L 28/60
See application file for complete search history.

(56) References Cited

U.S. PATENT DOCUMENTS

| | | |
|---|---|---|
| 5,999,010 A | 12/1999 | Arora et al. |
| 6,061,508 A | 5/2000 | Mehrotra et al. |
| 6,885,056 B1 | 4/2005 | Dornisch et al. |
| 7,089,516 B2 | 8/2006 | Arora et al. |
| 7,538,006 B1 | 5/2009 | Anderson et al. |
| 7,900,164 B1 | 3/2011 | Chen et al. |
| 9,698,213 B1 | 7/2017 | Yang |
| 9,985,089 B2 | 5/2018 | Yang |
| 2011/0018099 A1* | 1/2011 | Muramatsu .......... H05K 1/0231 257/532 |
| 2012/0119326 A1* | 5/2012 | Sugisaki ................ H01G 4/005 257/532 |
| 2013/0307158 A1* | 11/2013 | Anderson ................ H01G 4/33 257/773 |
| 2018/0158617 A1* | 6/2018 | Carver .................... H01G 4/242 |

* cited by examiner

*Primary Examiner* — Peniel M Gumedzoe
*Assistant Examiner* — Christopher A Johnson
(74) *Attorney, Agent, or Firm* — Hoffman Warnick LLC

(57) ABSTRACT

Embodiments of the disclosure provide a capacitor structure for an integrated circuit (IC), and methods to form the capacitor structure. The capacitor structure may include: a first ring electrode in an inter-level dielectric (ILD) layer on a substrate; an inner electrode positioned within the first ring electrode; and a capacitor dielectric separating the first ring electrode and the inner electrode, and separating a bottom surface of the inner electrode from the ILD layer.

20 Claims, 11 Drawing Sheets

CAPACITOR STRUCTURE FOR INTEGRATED CIRCUIT, AND RELATED METHODS

BACKGROUND

The present disclosure relates to integrated circuit (IC) structure formation, and more specifically, to a capacitor structure for an IC, and related methods to form the capacitor structure.

Capacitor structures in an IC conventionally include two metal plates with an insulator between the plates. In such a configuration, the plates must have a significant surface area to achieve desired capacitances. One conventional approach for integrating capacitors into an integrated circuit is to form transverse metal lines, or "fingers," extending outward from a larger wire interdigitating the transverse metal lines with similar metal lines of a nearby wire. However, such a configuration may impose limits on manufacturability and capacitance ranges as devices continue to decrease in size. Such limits on the size of a capacitor are of particular concern when a product specification requires an ultra-low capacitor, i.e., capacitors with no more than approximately 0.5 femtofarads (fF). In the case of a conventional capacitor, parasitic capacitance across electrodes through overlying and underlying device layers may prevent such low amounts of capacitance from being physically achievable in a single capacitor. Serial coupling of multiple capacitors to reduce the effective capacitance is also ineffective because adding more capacitors will reduce available space in a device structure.

SUMMARY

A first aspect of the disclosure is directed to a capacitor structure for an integrated circuit (IC), the capacitor structure including: a first ring electrode in an inter-level dielectric (ILD) layer on a substrate; an inner electrode positioned within the first ring electrode; and a capacitor dielectric separating the first ring electrode and the inner electrode, and separating a bottom surface of the inner electrode from the ILD layer.

A second aspect of the disclosure includes a method of forming a capacitor structure for an integrated circuit (IC), the method including: forming a first opening within an inter-level dielectric (ILD) layer on a substrate, wherein a vertical thickness of the first opening is less than a vertical thickness of the ILD layer above the substrate; forming a capacitor dielectric on a bottom surface and sidewalls of the first opening to partially fill the first opening; forming an inner electrode on the capacitor dielectric to fill a remaining portion of the first opening; forming a second opening within the ILD layer, wherein the second opening surrounds an outer perimeter sidewall of the capacitor dielectric; and forming a first ring electrode within the second opening, such that the capacitor dielectric separates the first ring electrode and the inner electrode.

A third aspect of the disclosure provides a method of forming a capacitor structure for an integrated circuit (IC), the method including: forming a first opening within an inter-level dielectric (ILD) layer on a substrate, wherein a vertical thickness of the first opening is less than a vertical thickness of the ILD layer above the substrate; forming a capacitor dielectric on a bottom surface and sidewalls of the first opening to partially fill the first opening, wherein the capacitor dielectric includes an electrode opening extending partially into the capacitor dielectric; forming a set of ring openings within the capacitor dielectric, each of the set of ring openings being concentric with the electrode opening and separated by respective portions of the capacitor dielectric, wherein a vertical thickness of each of the set of ring openings is less than a vertical thickness of the capacitor dielectric above the ILD layer; forming an inner electrode on the capacitor dielectric within the electrode opening; and forming a set of ring electrodes within the set of ring openings, such that portions of the capacitor dielectric separate the set of ring electrodes from the inner electrode.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 2:
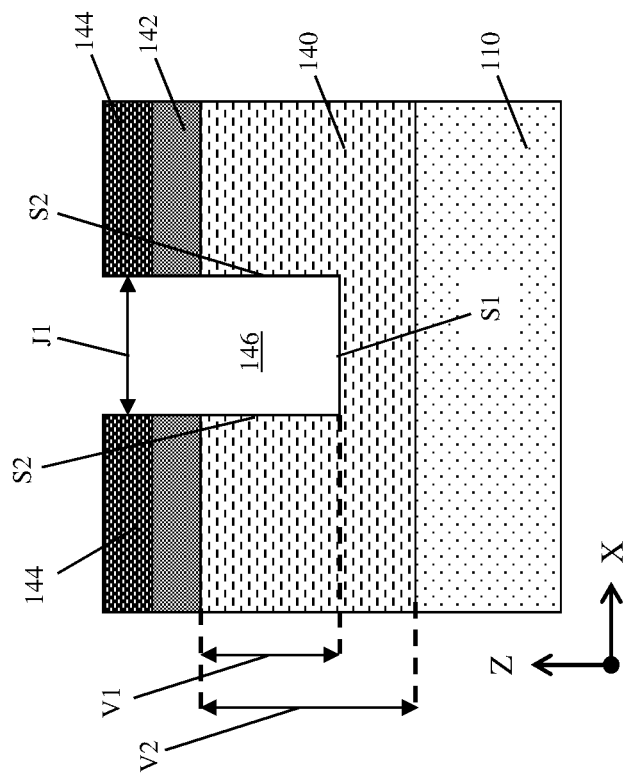
FIG. 2 shows a cross-sectional view of forming a first opening within an inter-level dielectric (ILD) layer according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a capacitor structure for an IC, and related methods to form the capacitor structure. Embodiments of the resistor structure may include, e.g., a first ring electrode in an inter-level dielectric (ILD) layer on a substrate, and an inner electrode positioned within the first ring electrode. A capacitor dielectric may separate the first ring electrode and the inner electrode, and separate a bottom surface of the inner electrode from the ILD layer. In this configuration, the first ring electrode, inner electrode, and capacitor dielectric may be contained wholly within a single ILD layer. In this configuration, the capacitor dielectric may include a scyphoid (e.g., a substantially cup-shaped structure, as discussed herein) to inhibit or eliminate parasitic fringe capacitance through the ILD layer. Methods according to embodiments of the disclosure are operable to form the capacitor structure, and optionally may form other portions of an IC.

Figure 1:
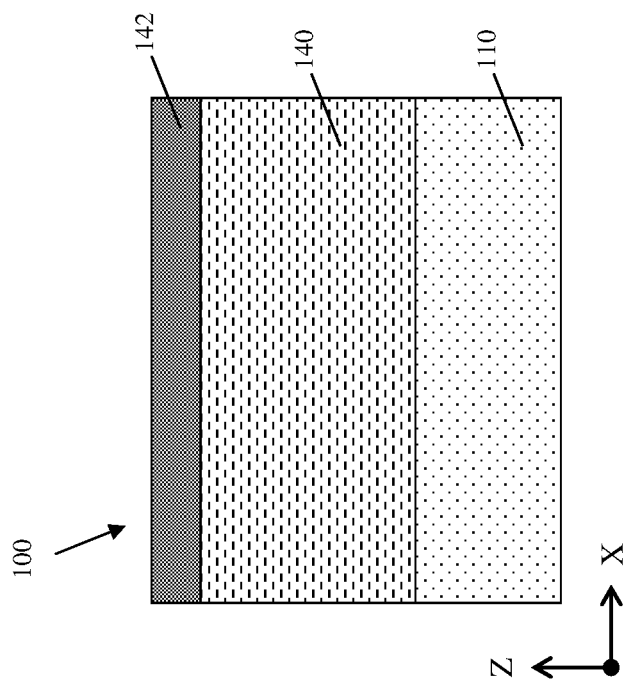
FIG. 1 shows a cross-sectional view of a preliminary structure to be processed according to embodiments of the disclosure.

FIG. 1 shows a cross-sectional view in plane X-Z of a preliminary structure 100 to be processed according to embodiments of the disclosure. The example preliminary structure 100 of FIG. 1 provides one initial set of materials targeted for use with embodiments of the disclosure, but it is understood that embodiments of the disclosure may be implemented on different designs without significant changes to the various example techniques discussed herein.

Various portions of preliminary structure 100 may be formed on a semiconductor substrate (simply "substrate" hereafter) 110. Substrate 110 may include, e.g., one or more currently-known or later developed semiconductor substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 110 is depicted by example as being a bulk layer of semiconductor material, but it is understood that other configurations of semiconductor material are possible.

Preliminary structure 100 includes inter-level dielectric (ILD) 140 over substrate 110. ILD layer 140 may be formed by non-selective or selective deposition. ILD layer 140 may include, e.g., one or more oxide-based dielectric materials suitable to physically and electrically separate respective layers of material in an IC structure. Oxide-based dielectric materials may also be appropriate for distinguishing ILD layer 140 from other dielectric materials, as discussed elsewhere herein. More generally, ILD layer 140 may include any now known or later developed ILD material such as but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

To prepare preliminary structure 100 for subsequent processing, embodiments of the disclosure may include forming a hard mask 142 on an upper surface of ILD layer 140. Hard mask 142 may include any currently known or later developed substance configured for placement beneath a photoresist (e.g., one or more layers of photoresist material as discussed elsewhere herein) to control the location(s) of subsequent etching. Hard mask 142 thus may include any conceivable masking material used in photolithography to control the transfer of a pattern from an overlying photoresist material onto preliminary structure 100. Hard mask 142 may include, e.g., one or more nitride-based masking materials such as titanium nitride (TiN or $TiN_xO_y$) or other metal-based hard mask materials having substantially similar properties.

Turning to FIG. 2, portions of ILD layer 140 may be removed for subsequent deposition, filling, etc., with various portions of a capacitor structure. FIG. 2 depicts forming a photoresist material 144 on portions of hard mask 142. Hard mask 142 may take the form of, e.g., an etchant-insoluble liquid deposited on the upper surface of hard mask 142 above preliminary structure 100 as a thin film then solidified into an etchant-soluble material by low temperature anneal after the subsequent mask deposition. In this case, photoresist material 144 may solidify in the areas where photoresist material 144 can be reached by UV radiation to allow photochemical reactions to change its properties. Hard mask 142 and photoresist material 144 may allow underlying portions of ILD layer 140 to be processed using photolithographic techniques. In photolithography, a radiation sensitive "resist" coating (e.g., photoresist material 144) is formed over one or more layers (e.g., ILD layer 140 and hard mask 142) which are to be treated, in some manner, such as to be selectively doped and/or to have a pattern transferred thereto. Photoresist material 144, itself may be patterned by being exposed to radiation, where the radiation (selectively) passes through an intervening mask (not shown) or template containing the pattern. As a result, the exposed or unexposed areas of photoresist material 144 become more or less soluble, depending on the type of photoresist used. A developer is then used to remove the more soluble areas of photoresist material 144 after it is patterned. The patterned photoresist material 144 can then serve shield underlying layers which can then be selectively treated, such as to receive dopants and/or to undergo etching as discussed herein, for example. Mask 142 and photoresist material 144 may include one or more openings with a width J1 sized to target an underlying cross-section of ILD layer 140. Though not shown specifically in FIG. 2, such openings in photoresist material 144 may be substantially rounded in shape or may have any other conceivable geometrical profile.

As shown in FIG. 2, a portion of ILD layer 140 beneath opening(s) in hard mask 142 and photoresist material 144 may be targeted for etching and partial removal in a next step of a method according to embodiments of the disclosure. Reactive ion etching (RIE) is one technique suitable for the recessing of ILD layer 140. Etching generally refers to the removal of material from a substrate (or structures formed on the substrate), and is often performed with a mask (e.g., hard mask 142) in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. The recessing may include any now known or later developed etching process appropriate to recess ILD layer 140, e.g., RIE for oxide dielectric materials. The etching of ILD layer 140 may form a first opening 146 having a vertical thickness V1 that is less than a vertical thickness V2 of ILD layer 140. Thus, first opening 146 may be formed to include a bottom surface S1 and sidewalls S2 formed entirely of ILD layer 140 material.

Figure 3:
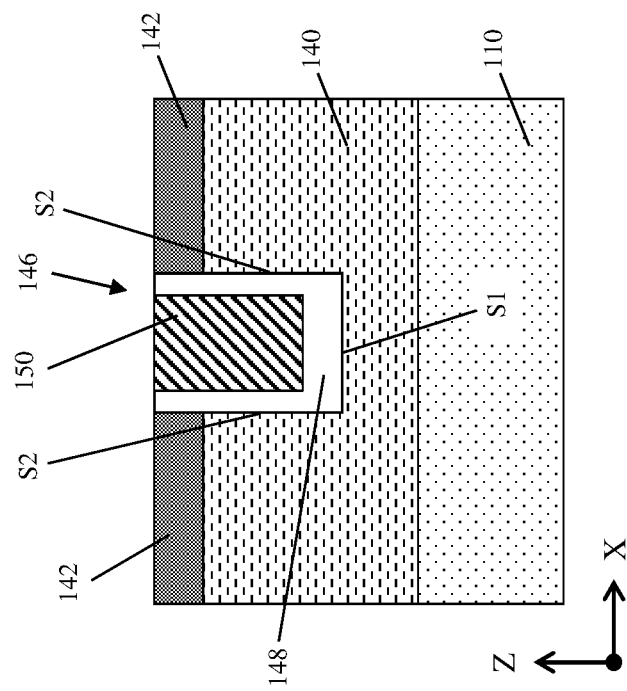
FIG. 3 shows a cross-sectional view of conformally depositing a capacitor dielectric within the first opening according to embodiments of the disclosure.

Proceeding to FIG. 3, embodiments of the disclosure may include forming a capacitor dielectric 148 to be positioned between two oppositely-charged plates. Capacitor dielectric 148 may initially take the form of a larger conformally-deposited layer, before being processed to define its geometrical profile in the capacitor structure. As shown in FIG. 3, photoresist material 144 (FIG. 2) may be removed (e.g., by stripping), while the remaining portions of previously-formed hard mask 142 may remain intact on ILD layer 140. Capacitor dielectric 148 may have a different material composition from ILD layer 140, and may be chosen to have a higher dielectric constant than the insulating material of ILD layer 140. According to one example, capacitor dielectric 148 may include one or more nitride-based dielectric materials, e.g., silicon nitride (SiN), while ILD layer 140 may include one or more oxide dielectric materials, e.g., silicon dioxide ($SiO_2$). In further embodiments, capacitor dielectric 148 may include any dielectric material having a higher dielectric constant than that of ILD layer 140. According to an example implementation, capacitor dielectric 148 may be formed to a vertical thickness of between approximately twenty-five nanometers (nm) and approximately fifty nm within first opening 146. Capacitor dielectric 148 may exhibit a similar horizontal thickness with respect to the sidewalls of first opening 146.

Capacitor dielectric 148 may be formed by conformal deposition. "Depositing" generally may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Conformal deposition, e.g., ALD, may cause capacitor dielectric 148 to be in contact with bottom surface S1 and sidewalls S2 of ILD layer 140. Capacitor dielectric 148 may be deposited conformally on sidewalls S2 of ILD layer 140. Some sidewalls of ILD layer 140 are not visible in FIG. 4, e.g., any sidewall portions located above or below the plane of the page. Capacitor dielectric 148, at this stage, may also be formed on remaining portions of hard mask 142 through the same conformal deposition process. The amount of deposited material may be controlled such that capacitor dielectric 148 only fills a portion of first opening 146. The remainder of first opening 146 may remain vacant after the depositing of capacitor dielectric 148 concludes. This remaining space within first opening 146 may be filled subsequently with other capacitor components.

Figure 4:
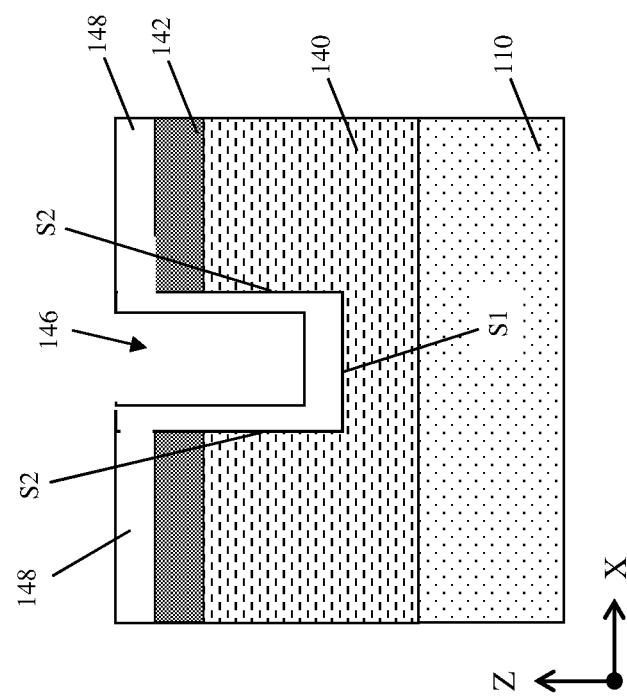
FIG. 4 shows a cross-sectional view of depositing an inner electrode on the capacitor dielectric to fill the first opening according to embodiments of the disclosure.

Turning to FIG. 4, methods according to the disclosure may include forming an inner electrode 150 on capacitor dielectric 148 to fill the remainder of first opening 146. Inner electrode 150 may include any currently known or later developed conductive substance capable of operating as a capacitor electrode in a device structure. As examples, inner electrode 150 may include any and/or all conductive materials such as copper (Cu), aluminum (Al), tungsten (W), cobalt (Co), titanium (Ti), etc. Inner electrode 150 may be formed, e.g., by non-conformal deposition of conductive materials within the remainder of first opening 146. Some portions of inner electrode 150 may also contact and overlie portions of capacitor dielectric 148 positioned outside first opening 146. In any case, the disclosure may include planarizing the structure above first opening 146 (e.g., by chemical mechanical planarization (CMP) or similar processes) to approximately the height of hard mask 142.

At this stage, capacitor dielectric 148 may exhibit a substantially scyphoid geometry through its continued contact with bottom surface S1 and sidewalls S2 of first opening 146. As used herein, the term "scyphoid" refers to a three-dimensional shape that substantially resembles a cup. Alternatively, a scyphoid geometry may be defined as a shape which includes a horizontally-extending first portion and an upwardly-extending second portion having a hollow interior, and connected to a perimeter cross-section of the first portion. Scyphoid geometries may variously exhibit substantially vertical sidewalls, sloped sidewalls, curvilinear sidewalls, and/or various other shapes featuring a solid lower portion together with a hollow upper portion. Capacitor dielectric 148 thus may physically separate inner electrode 150 from horizontally-adjacent and vertically-adjacent portions of ILD layer 140. The position and shape of capacitor dielectric 148 may reduce or eliminate parasitic "fringe capacitance" between capacitor plates through ILD layer 140. Various electrode materials formed on or adjacent capacitor dielectric 148 will be separated from each other by portions of capacitor dielectric 148. Capacitor dielectric 148 will thus cause the electrode material to store an electrical charge during operation, without alternative electrical pathways being available through ILD layer 140. By contrast, ILD layer 140 may provide an electrical pathway with a parasitic capacitance in alternative capacitor architectures.

Figure 5:
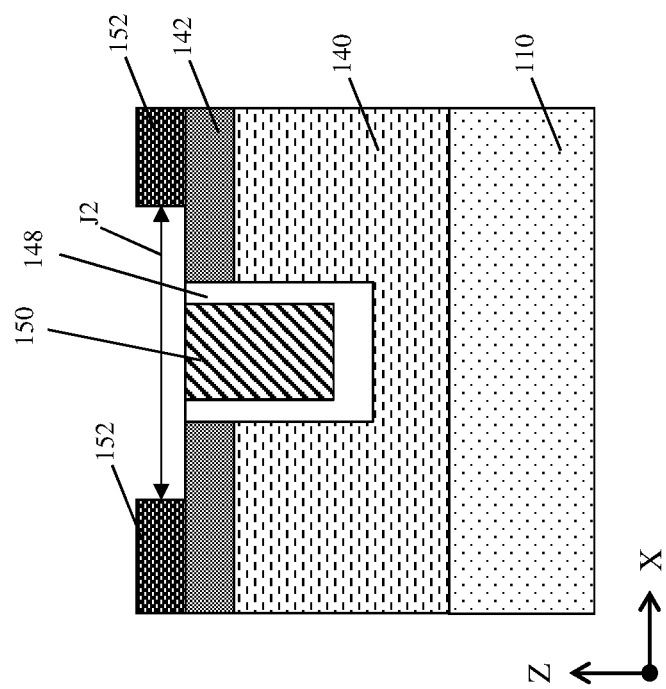
FIG. 5 shows a cross-sectional view of forming a mask to cover portions of the ILD layer according to embodiments of the disclosure.

Turning to FIG. 5, methods according to the disclosure are operable to form a capacitor structure in which one or more additional electrodes form a ring shape about capacitor dielectric 148 and inner electrode 150. As used herein, the term "ring" includes any enclosed rounded or non-rounded shape defining a hollow interior. In various embodiments, capacitor structures according to the disclosure may take the form of a substantially rounded, triangular, rectangular, and/or any other conceivable geometrical profile within plane X-Y. It is thus understood that the term "ring" does not imply or require a rounded geometry, and the substantially circular shape in the accompanying figures is provided solely as an example. The disclosure may include forming an additional photoresist material 152 on hard mask 142. As shown, additional photoresist material 152 may include an opening with a width J2 that is significantly wider than width J1 (FIG. 2) of a previously-discussed opening within photoresist material 144 (FIG. 2). Width J2 of the opening within additional photoresist material 152 may be shaped to expose portions of hard mask 142 located above unremoved portions of ILD layer 140. Using additional photoresist material 152, portions of hard mask 142 may be exposed to light and rendered soluble, thereby allowing portions of ILD layer 140 to be downwardly etched.

Figure 6:
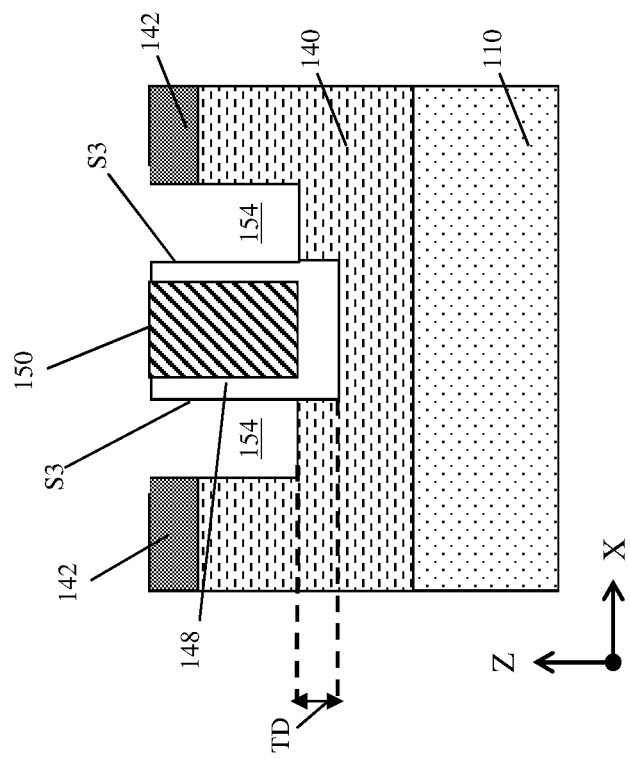
FIG. 6 shows a cross-sectional view of forming a second opening within the ILD layer adjacent the capacitor dielectric according to embodiments of the disclosure.

Referring to FIG. 6, methods according to the disclosure may include forming a second opening 154 within ILD layer 140. According to an example implementation, second opening 154 may be substantially ring-shaped to surround an outer perimeter sidewall S3 of capacitor dielectric 148. Although FIG. 6 provides a cross-sectional view, it is understood that each portion of second opening 154 may connect to the other through a pathway that extends in front of, and behind, the plane of the page to define a ring shape. Thus, although there appear to be two second openings 154 in the cross-sectional view of FIG. 6, these portions of the drawing illustrate two different cross-sections of the same ring-shaped second opening 154. Various capacitor structures illustrated elsewhere herein (e.g., in FIGS. 9 and 17) further demonstrate the ring shape of second opening 154 in various embodiments. To form second opening 154, exposed portions of hard mask 142 and ILD layer 140 may be selectively downwardly etched. According to one example, one or more etchants selective to oxide materials may remove hard mask 142 and the underlying ILD layer 140 without removing significant amounts of capacitor dielectric 148 and/or inner electrode 150 to form second opening 154. At this stage, capacitor dielectric 148 may continue to exhibit a scyphoid geometry, with the interior of capacitor dielectric 148 being filled with inner electrode 150. In some cases, second opening 154 may be shaped to have a bottom surface above a bottom surface of capacitor dielectric 148, as indicated by thickness differential TD. Additional photoresist material 152 may also be removed (e.g., by stripping or other mask removal techniques) after opening(s) 154 have been formed.

Figure 7:
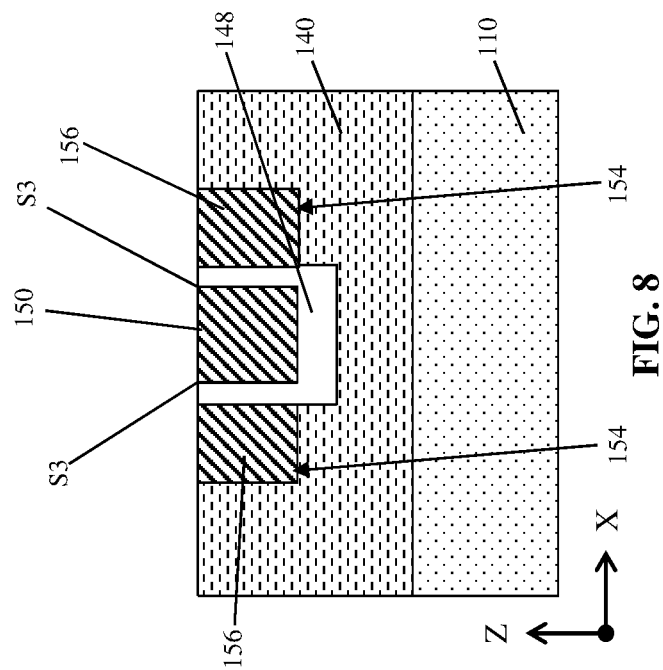
FIG. 7 shows a cross-sectional view of depositing a metal to fill the second opening according to embodiments of the disclosure.
Figure 8:
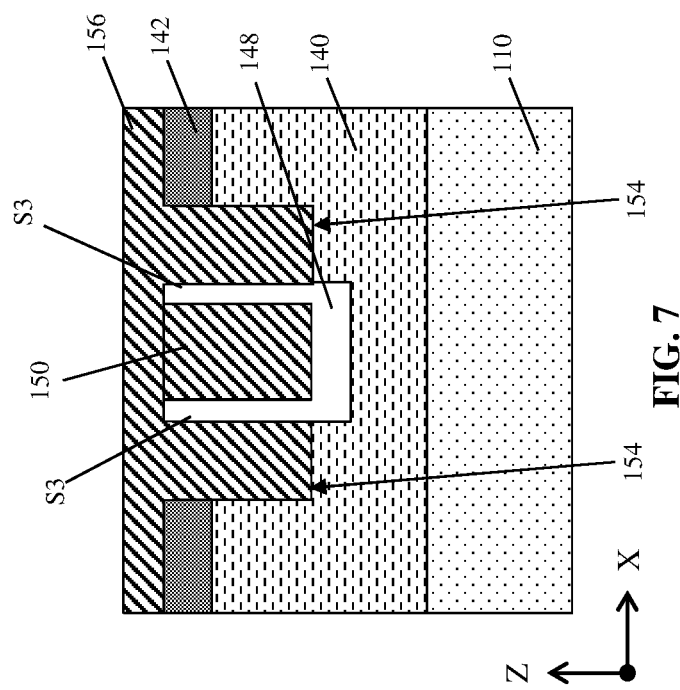
FIG. 8 shows a cross-sectional view of planarizing the metal to form a ring electrode according to embodiments of the disclosure.

Referring now to FIG. 7, embodiments of the disclosure include forming a first ring electrode 156 within second opening 154. First ring electrode 156 may define the second electrode of the eventual capacitor structure, and thus may be formed in the shape of a ring about outer perimeter sidewall of capacitor dielectric 148. As shown in FIG. 7, first ring electrode 156 may be formed by depositing a conductive material within second opening 154 alongside capacitor dielectric 148. Portions of first ring electrode 156 in some cases may be deposited to a height above hard mask 142, capacitor dielectric 148, and inner electrode 150. Referring briefly to FIG. 8, the initially-formed first ring electrode 156 may then be planarized (e.g., by CMP, etching, and/or other techniques) to approximately the height of ILD layer 140, thereby removing excess conductor material.

Figure 9:
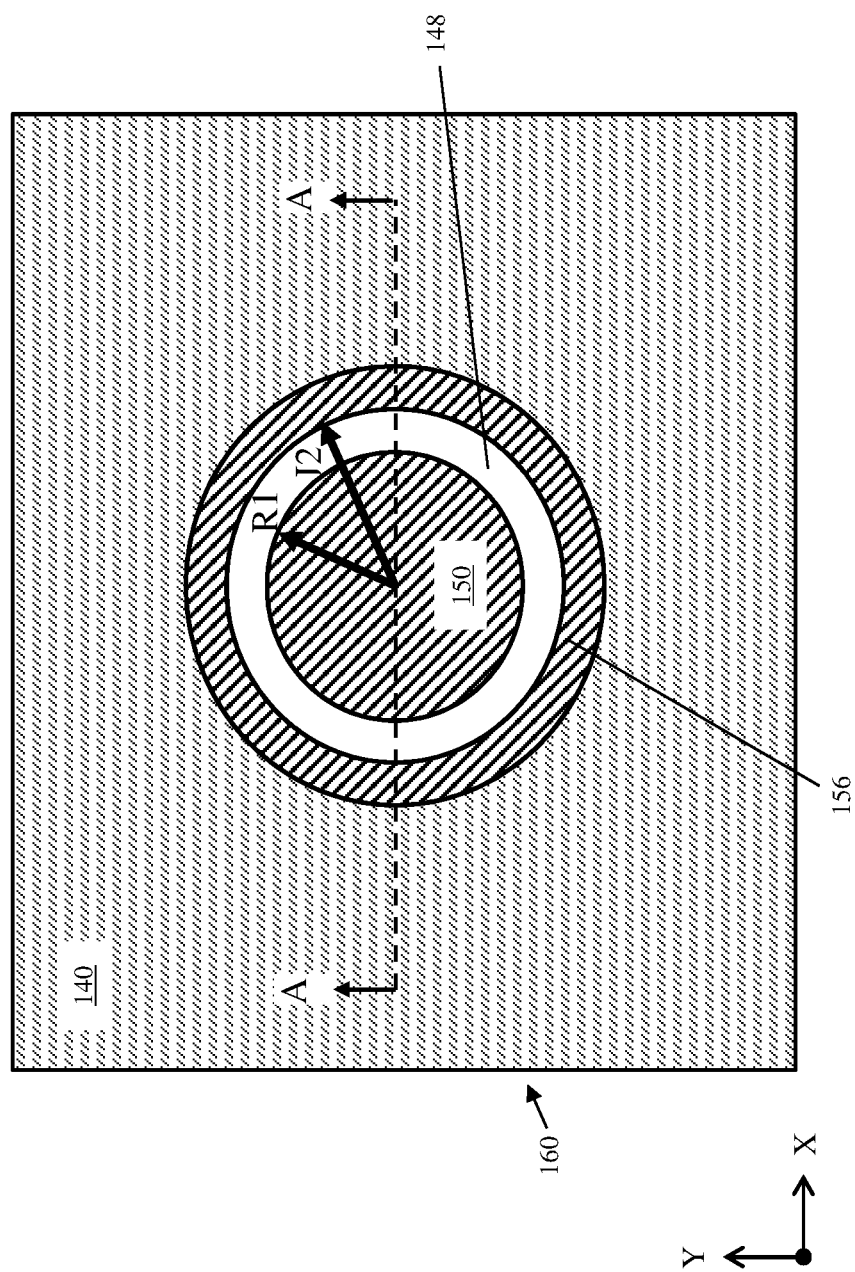
FIG. 9 shows a plan view in plane X-Y of a capacitor structure according to embodiments of the disclosure.
Figure 10:
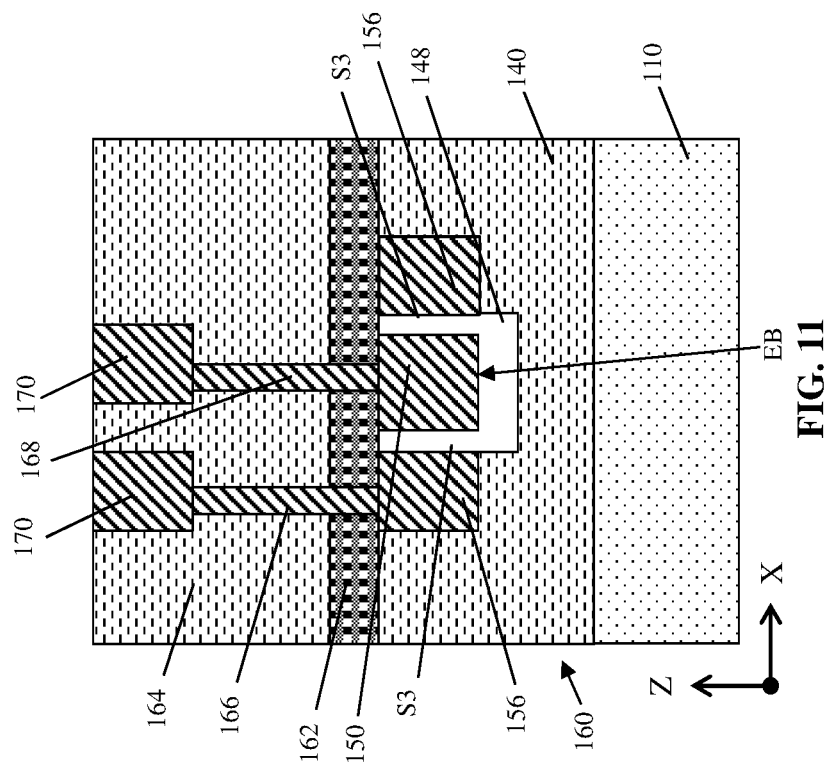
FIG. 10 shows a cross-sectional view of the capacitor structure along line A-A of FIG. 9 according to embodiments of the disclosure.

Referring now to FIGS. 9 and 10 together, the structure may be further processed to yield a capacitor structure 160 according to embodiments of the disclosure. A plan view of capacitor structure 160 is shown in FIG. 9, while a cross-sectional view of capacitor structure 160 is shown in FIG. 10 along line A-A in FIG. 9. Capacitor structure 160 is shown in FIGS. 9 and 10 according to one example implementation, but it is understood that further embodiments of capacitor structure 160 are possible, and several of such embodiments are discussed in further detail herein. To form capacitor structure 160 as shown in FIGS. 9 and 10, methods according to the disclosure may include non-selectively etching hard mask 142 (FIGS. 1-8) to remove hard mask 142. The same etching process, portions of ILD layer 140, capacitor dielectric 148, inner electrode 150, and first ring electrode 156 may be etched to a desired height above substrate 110.

As shown best in FIG. 9, capacitor structure 160 may include first ring electrode 156 within ILD layer 140 above substrate 110. Inner electrode 150 may be positioned within first ring electrode 156, e.g., within a horizontal interior thereof such that first ring electrode 156 surrounds inner electrode 150. In some cases, inner electrode 150 may be substantially concentric with capacitor dielectric 148 and first ring electrode 156. A first radius R1 of inner electrode 150 may be less than a second radius R2 denoting the outer perimeter of capacitor dielectric 148 and the inner perimeter of first ring electrode 156. Capacitor dielectric 148 may separate first ring electrode 156 and inner electrode 150 from ILD layer 140 by being below a bottom surface of inner electrode EB. During operation, inner electrode 150 and ring electrode 156 may become oppositely-charged when subjected to an electrical potential thereacross, e.g., due to the presence of capacitor dielectric 148. This structure will cause capacitor structure 160 to store an electrical charge during operation, similar to a conventional parallel plate arrangement. However, capacitor structure 160 may be operable to form a low-capacitance capacitor in a single layer of ILD layer 140, e.g., through the structure of inner electrode 150 and ring electrode 156.

Figure 11:
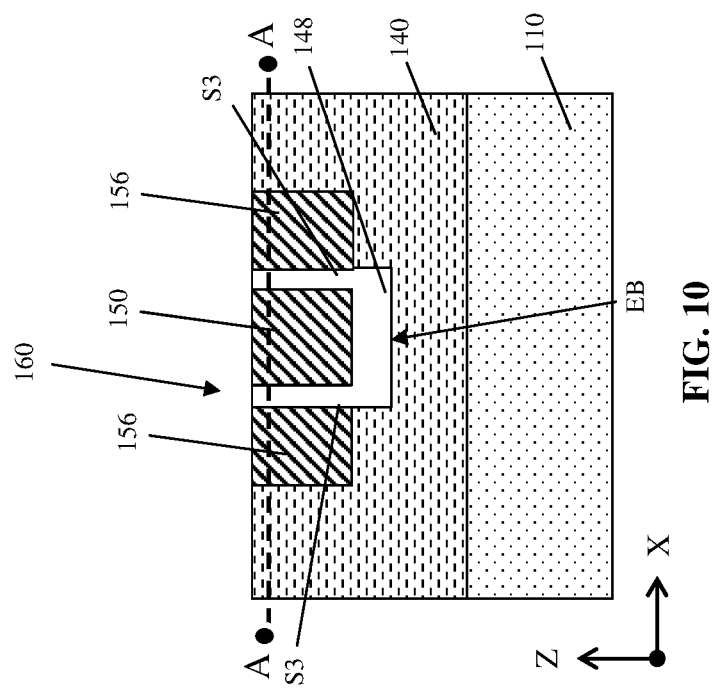
FIG. 11 shows a cross-sectional view of forming a barrier film and contacts to the inner electrode and ring electrode according to embodiments of the disclosure.

Referring to FIG. 11, continued processing according to the disclosure may include forming additional components to electrically connect capacitor structure 160 to other portions of an IC. Further processing may include, e.g., forming a barrier film 162 above ILD layer 140, capacitor dielectric 148, inner electrode 150, and first ring electrode 156 to vertically isolate capacitor structure 160 from overlying wires and vias. Barrier film 162 may include one or more electrically insulative materials with a particularly high resistance to etching. Barrier film 162 more specifically may be formed as an "etch stop layer," configured to prevent underlying device components from being removed or modified in subsequent processing. Barrier film 162 thus may include, e.g., an oxygen-doped silicon carbide (SiC:O) layer, a nitrogen-doped silicon carbide (SiC:N) layer, or other material with similar properties. Continued processing may include forming an additional ILD layer 164 on barrier film 162. Portions of additional ILD layer 164 may be removed and thereafter filled with conductive materials to define, e.g., a first contact 166 to first ring electrode 156 and a second contact 168 to inner electrode 150. Contacts 166, 168 may extend vertically through barrier film 162 and additional ILD layer 164 to couple each electrode of capacitor structure 160 to one or more metal wires 170 positioned, e.g., within additional ILD layer 164.

Figure 12:
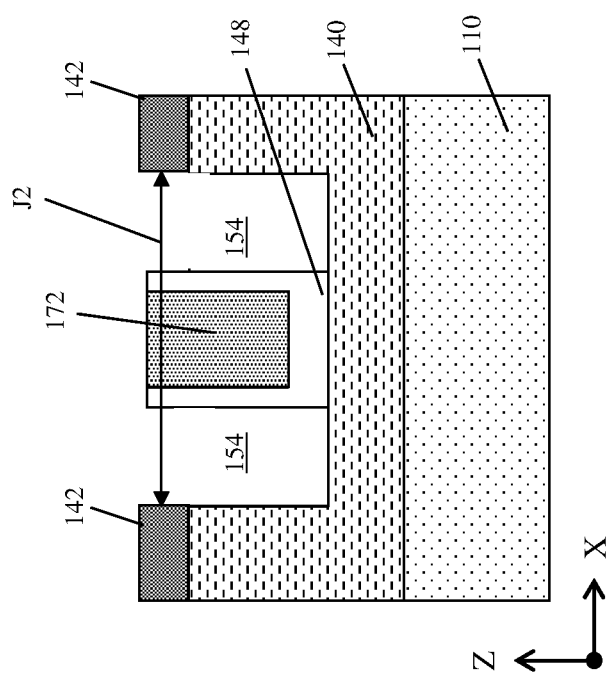
FIG. 12 shows a cross-sectional view of forming an electrode fill on the capacitor dielectric and forming a second opening according to further embodiments of the disclosure.

Referring now to FIG. 12 in view of FIG. 5, further embodiments of the disclosure may include methods to form capacitor structure 160 (FIGS. 9-11) with more than two electrodes. Multiple electrodes may allow the eventual capacitor structure 160 to store charge across multiple regions of capacitor dielectric material. Capacitor dielectric 148 nonetheless may have an unchanged material composition (e.g., one or more nitride dielectric materials) and/or set of dimensions (e.g., a vertical thickness of between twenty-five and fifty nm) as compared to other embodiments. According to an example, capacitor dielectric 148 may be filled with an inner electrode fill 172, e.g., amorphous silicon (a-Si) or other placeholder material capable of being selectively etched and replaced with one or more conductive materials in further processes. In alternative embodiments, inner electrode fill 172 may include the conductive electrode material configured for use in a capacitor structure, e.g., the same material as inner electrode 150 (FIGS. 4-11). The method may continue by forming second opening 154 within ILD layer 140 about capacitor dielectric 148, as discussed elsewhere herein. Second opening 154 more specifically may be formed in the shape of a ring about capacitor dielectric 148, and with the aid of hard mask 142. Hard mask 142 may be patterned with the aid of an additional photoresist material (not shown) with openings shaped to target and remove hard mask 142.

Figure 13:
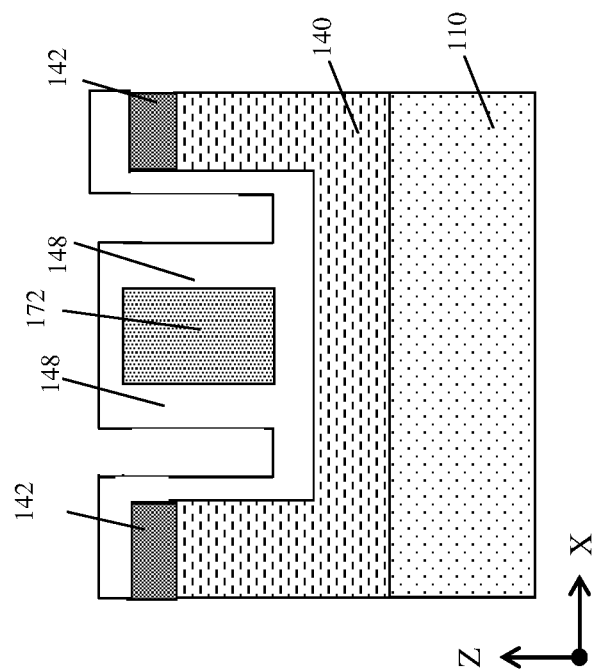
FIG. 13 shows a cross-sectional view of conformally depositing additional capacitor dielectric material within the second opening according to further embodiments of the disclosure.

Proceeding to FIG. 13, embodiments of the disclosure may include forming additional dielectric material to serve as a foundation for multiple electrode materials. As shown, the disclosure may include forming additional capacitor dielectric 148 material, e.g., by conformal deposition within second opening 154. Similar to other examples discussed herein, capacitor dielectric 148 may be formed on the lowermost surface and sidewalls of second opening 154. Capacitor dielectric 148 may initially be formed on hard mask 142, including its upper surface, As a result of the conformal deposition process as shown. A portion of second opening 154 may remain unfilled, e.g., by controlling the time over which dielectric material is conformally deposited. At this stage, capacitor dielectric 148 may continue to include a substantially scyphoid geometry, but with an additional ring portion extending upward from a lower portion of capacitor dielectric 148 and surrounding inner electrode fill 172.

Figure 14:
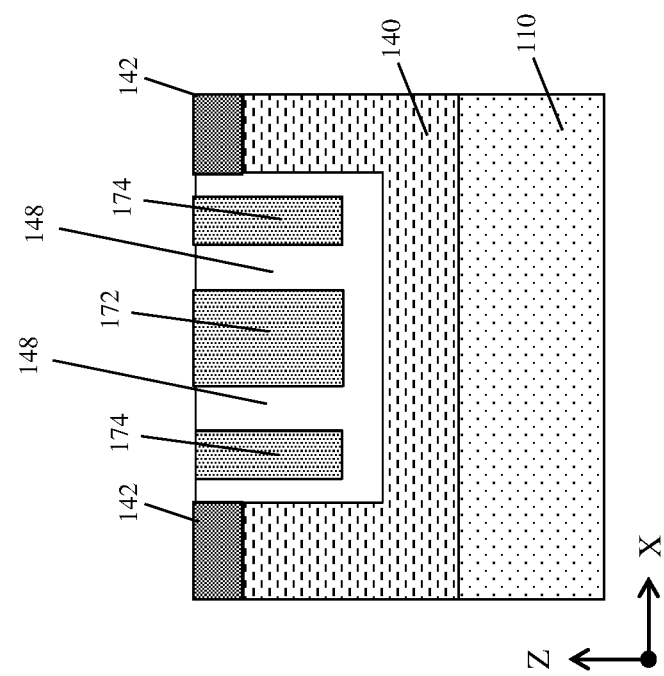
FIG. 14 shows a cross-sectional view of forming an additional electrode fill according to further embodiments of the disclosure.

Referring now to FIG. 14, various embodiments of the disclosure may include forming additional material within second opening 154 (FIGS. 12, 13) to fill the vacant space therein. According to an example, the disclosure may include forming a first ring electrode fill 174 within capacitor dielectric 148 to fill second opening 154. Capacitor dielectric 148 may be formed by way of a selective or non-selective deposition on capacitor dielectric 148, followed by a planarization (e.g., by CMP) or alternatively an etch back to the upper surface of capacitor dielectric 148. At this stage, first ring electrode fill 174 may horizontally surround inner electrode fill 172 similarly to the previously-discussed inner electrode 150 (FIGS. 5-11) and first ring electrode 156 (FIGS. 7-11) in capacitor structure 160 (FIGS. 9-11). In further alternatives, first ring electrode 156 can be formed on capacitor dielectric 148 directly, without first ring electrode fill 174 being formed as a placeholder material.

Figure 15:
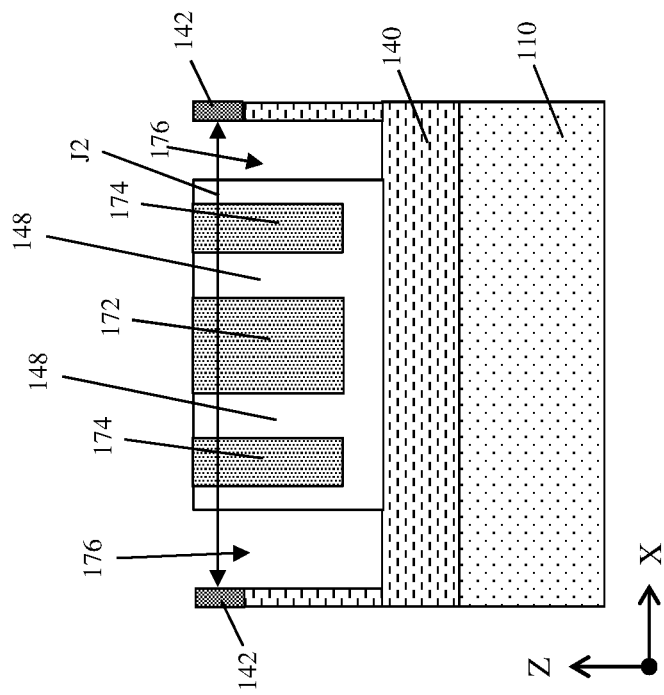
FIG. 15 shows a cross-sectional view of forming a third opening within the ILD layer according to further embodiments of the disclosure.
Figure 16:
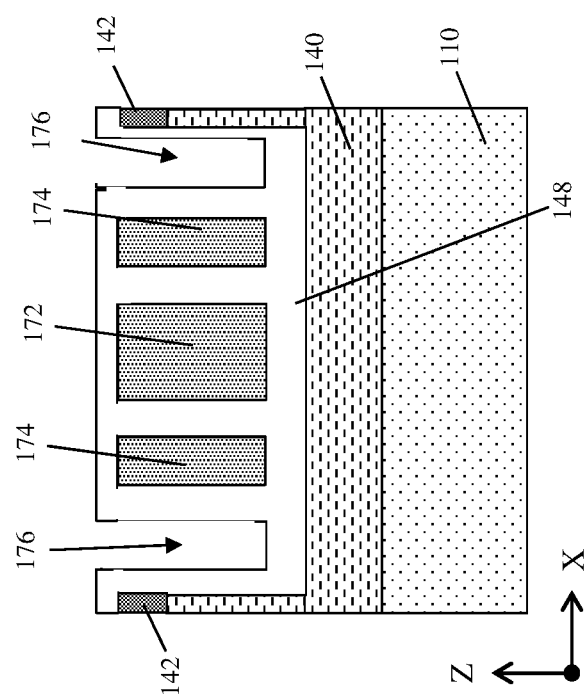
FIG. 16 shows a cross-sectional view of conformally depositing additional capacitor dielectric material within the third opening according to further embodiments of the disclosure.

Turning to FIG. 15, the processes discussed herein to remove portions of ILD layer 140 to form additional openings to be filled with capacitor dielectric 148 and additional ring electrode fills may repeated several times to form a set of multiple ring openings in one capacitor structure. FIG. 15 depicts, e.g., removing additional portions of hard mask 142 to create a third opening M3 above ILD layer 140. Additional portions of hard mask 142 may be removed with the aid of one or more additional masks (not shown) to form the pattern of third opening M3 within hard mask 142. The exposed portions of ILD layer 140 may be partially etched to form a third opening 176 therein. Third opening may have approximately the same thickness as capacitor dielectric 148, and thus may not expose substrate 110 thereunder. Referring briefly to FIG. 16, third opening 176 may be formed with additional portions of capacitor dielectric 148. Capacitor dielectric 148 may be formed by conformally depositing additional capacitor dielectric material on the lower surface and sidewalls of third opening 176, including the previously-formed portions of capacitor dielectric 148. As noted previously, portions of the deposited capacitor dielectric 148 may also contact and overlie remaining portions of hard mask 142. A remaining portion of third opening 176 may be unfilled with capacitor dielectric 148, similar to the forming capacitor dielectric material in other openings discussed herein.

Figure 17:
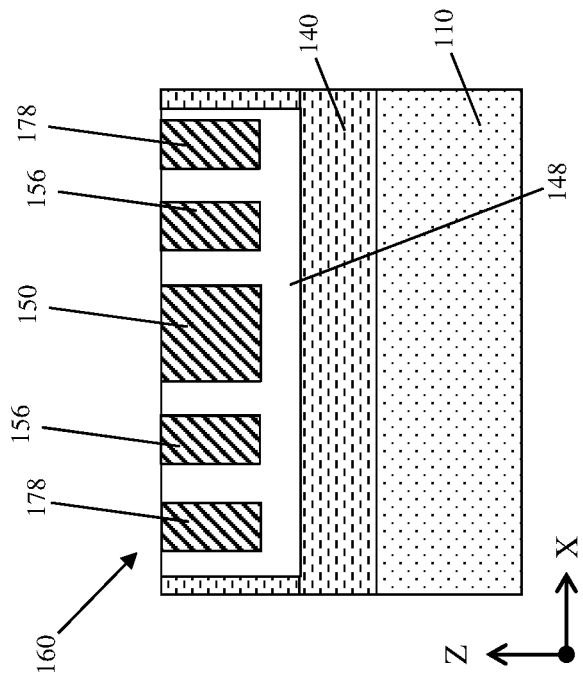
FIG. 17 shows a cross-sectional view of removing the electrode fill material and forming electrode material according to further embodiments of the disclosure.

Referring now to FIG. 17, additional fill materials may be formed within capacitor dielectric 148 after a desired amount of capacitor dielectric 148 is formed. According to the example shown in FIG. 17, capacitor dielectric 148 may be shaped to hold a set of two ring electrodes therein. However, capacitor dielectric 148 may be sized to hold any desired number of electrodes therein, e.g., by repeating embodiments of the various processes discussed herein as desired. Continued processing may include removing electrode fills 172, 174 (e.g., by selective etch) and thereafter forming electrode material on capacitor dielectric 148. According to one example, the disclosure may include forming inner electrode 150, first ring electrode 156, and a second ring electrode 178 on capacitor dielectric 148. In some cases, each electrode 150, 156, 178 may be formed by a single deposition of conductive material and subsequent etching to approximately the height of ILD layer 140.

Figure 18:
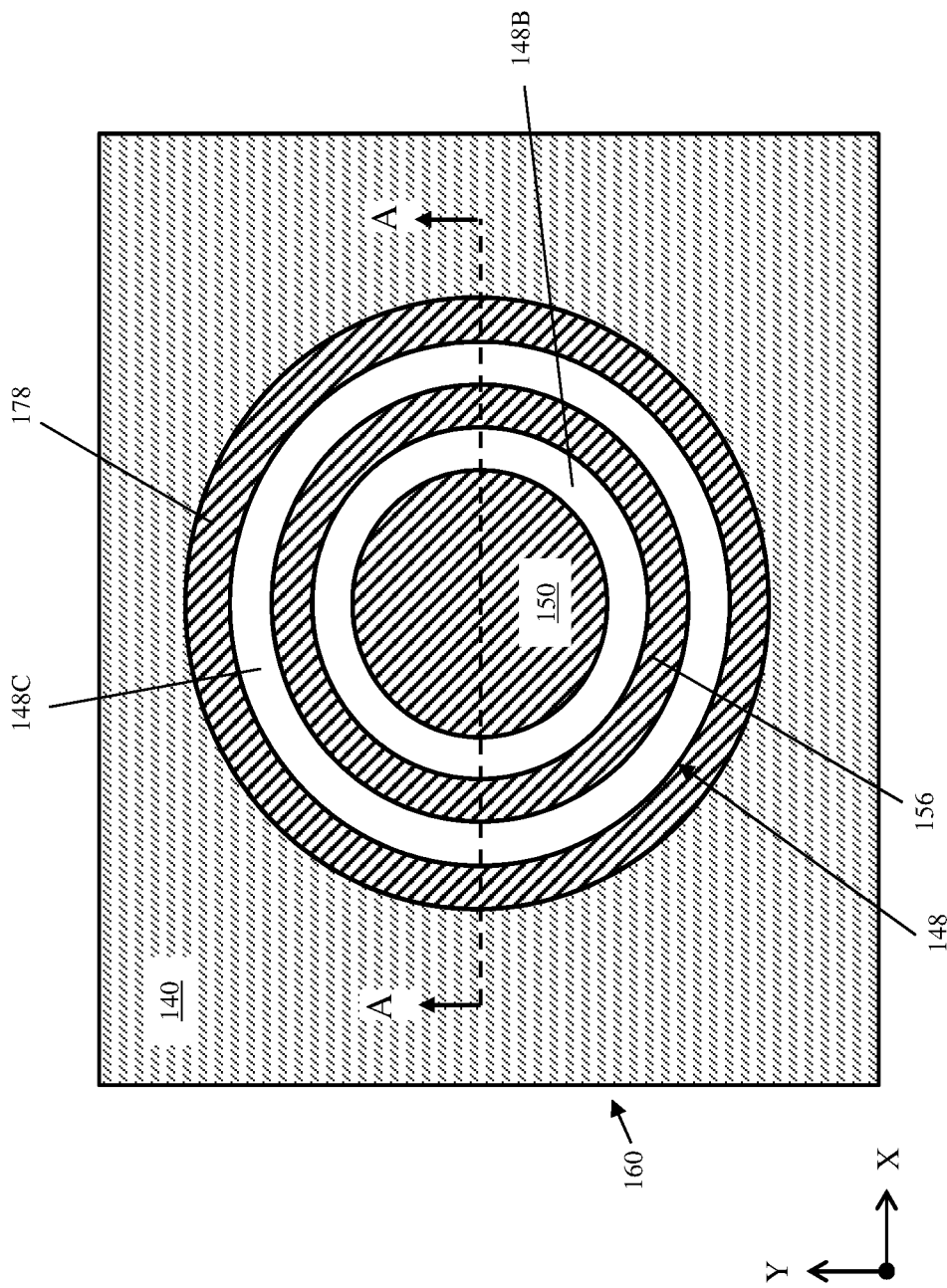
FIG. 18 shows a plan view of a capacitor structure according to embodiments of the disclosure.
Figure 19:
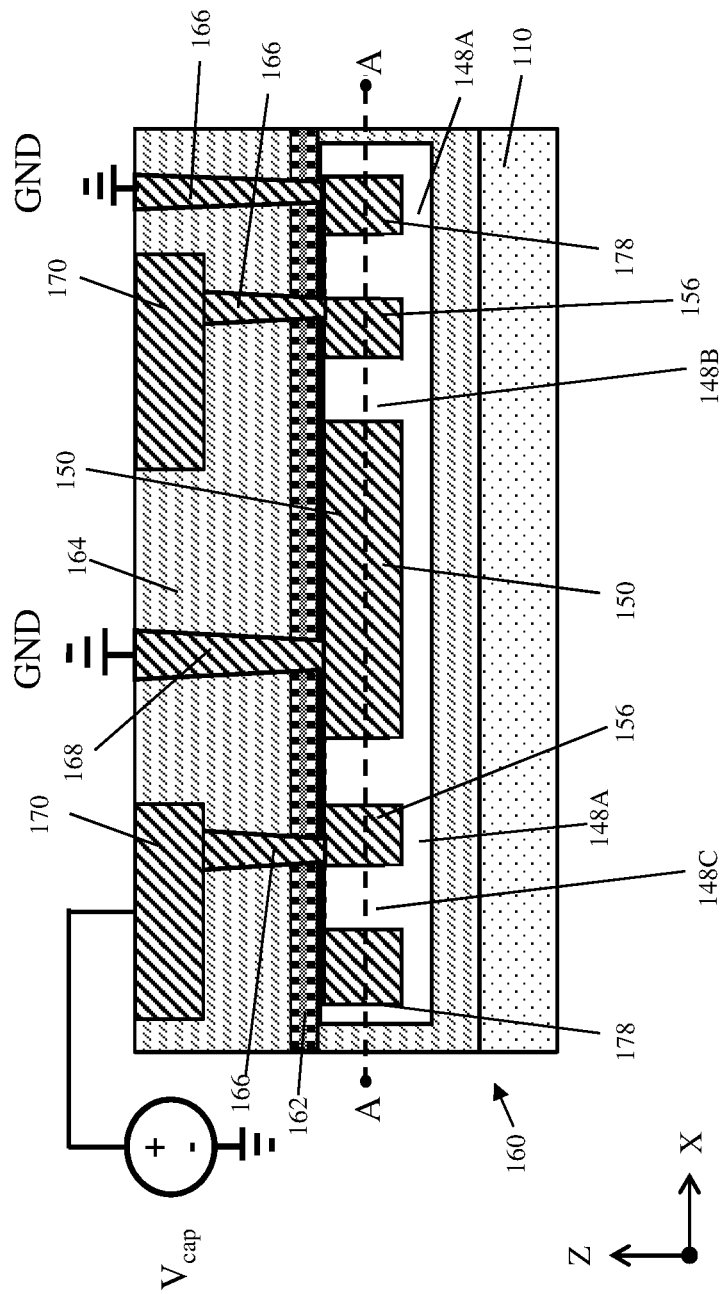
FIG. 19 shows a cross-sectional view of the capacitor structure and electrical couplings thereto according to embodiments of the disclosure.

Turning now to FIGS. 18 and 19 together, embodiments of capacitor structure 160 may include multiple ring electrodes 156, 178 within ILD layer 140 and surrounding inner electrode 150. A plan view of capacitor structure 160 is shown in FIG. 18 while FIG. 19 provides a cross-sectional view of capacitor structure 160 along line A-A of FIG. 18. Capacitor structure 160 may include inner electrode 150 and first ring electrode 156, separated from each other by portions of capacitor dielectric 148 as discussed elsewhere herein. Additionally, capacitor structure 160 may include first ring electrode 156 as one of a set of ring electrodes. The set of ring electrodes thus may include second ring electrode 178 surrounding first ring electrode 156. As shown, portions of capacitor dielectric 148 may separate first ring electrode 156 from second ring electrode 178. As with other examples discussed herein, capacitor dielectric 148 may separate a bottom surface of each ring electrode 156, 178 from an underlying portion of ILD layer 140. In this case, capacitor dielectric 148 may continue to exhibit a substantially scyphoid geometry but may also be sub-divided into multiple regions. Such regions may be structurally continuous with each other, and have been separately identified herein to further illustrate structural features according to various embodiments. Capacitor dielectric 148 may include, e.g., a dielectric base 148A (FIG. 19 only) positioned on ILD layer 140, e.g., as a horizontally-extending body on ILD layer 140. Capacitor dielectric 148 may also include, e.g., multiple dielectric rings 148B extending upward from dielectric base 148A. As shown, one dielectric ring 148B may be located horizontally between inner electrode 150 and first ring electrode 156, and another dielectric ring 148C may be located horizontally between first and second ring electrodes 156, 178.

Referring specifically to FIG. 19, methods according to the disclosure may include forming additional components for electrically connecting capacitor structure 160 to other features of a device. As discussed elsewhere herein, methods according to the disclosure may include forming barrier film 162 on an upper surface of ILD layer 140, capacitor dielectric 148, inner electrode 150, first ring electrode 156, and second ring electrode 178. Continued processing may then include forming additional ILD layer 164 on barrier film 162, followed by forming first and second contacts 166, 168 to ring electrode(s) 156, 178 and inner electrode 150, respectively. According to an example, a set of first contact(s) 166 may electrically couple first ring electrode 156 to metal wires 170 in additional ILD layer 164. Metal wires 170 in turn may be coupled to other circuit components and/or features. For instance, a capacitor voltage $V_{cap}$ may be coupled to first ring electrode 156 through metal wire 170 and first contact 166. According to a further example, second ring electrode 178 may be electrically coupled to ground GND through another first contact 166. In addition, inner electrode 150 may be coupled to ground GND through second contact 168. In this case, inner electrode 150 and second ring electrode 178 are each in electrical communication with first ring electrode 156 through respective portions of capacitor dielectric 148. In various alternative embodiments, inner electrode 150, second ring electrode 178, and/or other conductive portions of capacitor structure 160 may be coupled to capacitor voltage $V_{cap}$ while first ring electrode 156 and/or other components may be coupled ground GND.

Embodiments of capacitor structure 160, however formed or structurally configured, may provide a small-scale capacitor structure capable of being positioned within a single layer of ILD layer 140. Moreover, the presence of first ring electrode 156 and/or second ring electrode 178, together with capacitor dielectric 148, may provide a scalable low-capacitance architecture capable of providing lower levels of capacitance than conventional capacitor architectures. Additionally, embodiments of the disclosure allow a circuit manufacturer to form as many ring electrodes as desired within ILD layer 140, thereby allowing the capacitance of capacitor structure 160 to be further customized for different products and/or implementations. Embodiments of the disclosure, moreover, have a reduced need for space to accommodate additional electrodes than would be needed in the case of capacitors with conventional rectangular electrodes. Nonetheless, portions of capacitor dielectric 148 may interdigitate with respective electrodes 150, 156, 178, to provide efficient use of space. The ability to form capacitor dielectric 148 in a substantially scyphoid geometry may contribute to these advantages, among others.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A capacitor structure for an integrated circuit (IC), the capacitor structure including:
    a first ring electrode in an inter-level dielectric (ILD) layer on a substrate, and a top surface of the first ring electrode substantially coplanar with a top surface of the ILD layer;
    an inner electrode positioned within the first ring electrode; and
    a capacitor dielectric separating the first ring electrode and the inner electrode, and separating a bottom surface of the inner electrode from the ILD layer.

2. The capacitor structure of claim 1, wherein the capacitor dielectric includes a scyphoid geometry.

3. The capacitor structure of claim 1, wherein a vertical thickness of the capacitor dielectric between the ILD layer and the bottom surface of the inner electrode is between approximately twenty-five nanometers (nm) and approximately fifty nm.

4. The capacitor structure of claim 1, wherein the ILD layer includes an oxide dielectric material and wherein the capacitor dielectric includes a nitride dielectric material.

5. The capacitor structure of claim 1, wherein the first ring electrode is substantially concentric with the inner electrode.

6. The capacitor structure of claim 1, further comprising a second ring electrode in the ILD layer, the second ring electrode surrounding the first ring electrode, and wherein the capacitor dielectric further separates the first ring electrode from the second ring electrode, and separates a bottom surface of the second ring electrode from the ILD layer.

7. The capacitor structure of claim 6, wherein the capacitor dielectric includes a dielectric base on the ILD layer, a first dielectric ring extending upward from the dielectric base between the inner electrode and the first ring electrode, and a second dielectric ring extending upward from the dielectric base between the first ring electrode and the second ring electrode.

8. The capacitor structure of claim 1, wherein the ILD layer includes a bottom surface below a bottom surface of the capacitor dielectric.

9. An integrated circuit (IC) structure comprising:
    a capacitor structure, the capacitor structure including:
        a first ring electrode in an inter-level dielectric (ILD) layer on a substrate;
        an inner electrode positioned within, and concentric with, the first ring electrode;
        a capacitor dielectric separating the first ring electrode and the inner electrode, and separating a bottom surface of the inner electrode from the ILD layer, and a top surface of the capacitor dielectric substantially coplanar with a top surface of the ILD layer;
        a second ring electrode in the ILD layer, the second ring electrode surrounding and concentric with the first ring electrode, and wherein the capacitor dielectric further separates the first ring electrode from the second ring electrode, and separates a bottom surface of the second ring electrode from the ILD layer; and
    a barrier film on the top surface of the ILD layer and the top surface of the capacitor dielectric.

10. The the IC structure of claim 9, wherein the capacitor dielectric includes a scyphoid geometry.

11. The the IC structure of claim 9, wherein a vertical thickness of the capacitor dielectric between the ILD layer and the bottom surface of the inner electrode is between approximately twenty-five nanometers (nm) and approximately fifty nm.

12. The the IC structure of claim 9, wherein the ILD layer includes an oxide dielectric material and wherein the capacitor dielectric includes a nitride dielectric material.

13. The the IC structure of claim 9, wherein the capacitor dielectric includes a dielectric base on the ILD layer, a first dielectric ring extending upward from the dielectric base between the inner electrode and the first ring electrode, and a second dielectric ring extending upward from the dielectric base between the first ring electrode and the second ring electrode.

14. The IC structure of claim 9, wherein the ILD layer includes a bottom surface below a bottom surface of the capacitor dielectric of the capacitor structure.

15. A capacitor structure for an integrated circuit (IC), the capacitor structure including:
    a first ring electrode in an inter-level dielectric (ILD) layer on a substrate, and a top surface of the first ring electrode substantially coplanar with a top surface of the ILD layer, the ILD layer including an oxide;
    an inner electrode positioned within the first ring electrode; and
    a capacitor dielectric separating the first ring electrode and the inner electrode, and separating a bottom surface of the inner electrode from the ILD layer, wherein the capacitor dielectric has a scyphoid geometry, and includes a nitride dielectric material.

16. The capacitor structure of claim 15, wherein a vertical thickness of the capacitor dielectric between the ILD layer and the bottom surface of the inner electrode is between approximately twenty-five nanometers (nm) and approximately fifty nm.

17. The capacitor structure of claim 15, wherein the first ring electrode is substantially concentric with the inner electrode.

18. The capacitor structure of claim 15, further comprising a second ring electrode in the ILD layer, the second ring electrode surrounding the first ring electrode, and wherein the capacitor dielectric further separates the first ring electrode from the second ring electrode, and separates a bottom surface of the second ring electrode from the ILD layer.

19. The capacitor structure of claim 15, wherein the capacitor dielectric includes a dielectric base on the ILD layer, a first dielectric ring extending upward from the dielectric base between the inner electrode and the first ring electrode, and a second dielectric ring extending upward from the dielectric base between the first ring electrode and the second ring electrode.

20. The capacitor structure of claim 15, wherein the ILD layer includes a bottom surface, below a bottom surface of the capacitor dielectric.

* * * * *